United States Patent
Park et al.

(10) Patent No.: US 9,966,456 B1
(45) Date of Patent: May 8, 2018

(54) METHODS OF FORMING GATE ELECTRODES ON A VERTICAL TRANSISTOR DEVICE

(71) Applicant: GLOBALFOUNDRIES Inc., Grand Cayman (KY)

(72) Inventors: Chanro Park, Clifton Park, NY (US); Steven Bentley, Menands, NY (US); Hoon Kim, Clifton Park, NY (US); Min Gyu Sung, Latham, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 18 days.

(21) Appl. No.: 15/345,644

(22) Filed: Nov. 8, 2016

(51) Int. Cl.
*H01L 29/66* (2006.01)
*H01L 21/3213* (2006.01)
*H01L 21/288* (2006.01)
*H01L 21/321* (2006.01)

(52) U.S. Cl.
CPC ...... *H01L 29/66666* (2013.01); *H01L 21/288* (2013.01); *H01L 21/32115* (2013.01); *H01L 21/32133* (2013.01); *H01L 21/32139* (2013.01)

(58) Field of Classification Search
CPC ....... H01L 21/76264; H01L 21/823487; H01L 27/10876; H01L 27/1211
See application file for complete search history.

(56) References Cited

U.S. PATENT DOCUMENTS

| | | |
|---|---|---|
| 5,342,797 A | 8/1994 | Sapp et al. |
| 5,414,289 A | 5/1995 | Fitch et al. |
| 6,372,559 B1 | 4/2002 | Crowder et al. |
| 6,686,604 B2 | 2/2004 | Layman et al. |
| 6,690,040 B2 | 2/2004 | Chaudhry et al. |
| 6,759,730 B2 | 7/2004 | Chaudhry et al. |
| 7,241,655 B2 | 7/2007 | Tang et al. |
| 7,465,622 B2 | 12/2008 | Lin |
| 7,666,733 B2 | 2/2010 | Delconibus |
| 7,700,432 B2 | 4/2010 | Chaudhry et al. |
| 8,637,849 B2 | 1/2014 | Deligianni et al. |
| 9,177,785 B1 | 11/2015 | Kelly et al. |

(Continued)

OTHER PUBLICATIONS

Hergenrother et al., "The Vertical Replacement-Gate (VRG) MOSFET: A 50-nm Vertical MOSFET with Lithography-Independent Gate Length," IEDM 99-75, IEEE 1999.

(Continued)

*Primary Examiner* — Mohammad Choudhry
(74) *Attorney, Agent, or Firm* — Amerson Law Firm, PLLC

(57) ABSTRACT

One illustrative method of forming a vertical transistor device disclosed herein includes, among other things, forming bottom source/drain (S/D) regions. A plurality of vertically oriented channel semiconductor structures is formed above the bottom source/drain (S/D) regions. A gate insulation layer is formed above the vertically oriented channel semiconductor structures. A conformal layer of conductive gate material is formed above the gate insulation layer. The conformal layer of conductive material is etched to define conductive gate spacers on sidewalls of the vertically oriented channel semiconductor structures. Top source/drain (S/D) regions are formed above the vertically oriented channel semiconductor structures.

20 Claims, 16 Drawing Sheets

(56) References Cited

U.S. PATENT DOCUMENTS

| | | | |
|---|---|---|---|
| 9,224,840 B2 | 12/2015 | Flachowsky et al. | |
| 9,278,362 B2 | 3/2016 | Basu et al. | |
| 9,318,583 B2 * | 4/2016 | Verhulst | H01L 29/068 |
| 9,385,195 B1 | 7/2016 | Zhang | |
| 9,530,863 B1 * | 12/2016 | Zhang | H01L 29/66545 |
| 9,660,028 B1 | 5/2017 | Cheng et al. | |
| 2003/0047749 A1 | 3/2003 | Chaudhry et al. | |
| 2003/0119237 A1 | 6/2003 | Chittipeddi et al. | |
| 2007/0111414 A1 | 5/2007 | Chaudhry et al. | |
| 2008/0054350 A1 | 3/2008 | Breitwisch et al. | |
| 2009/0085088 A1 | 4/2009 | Takaishi | |
| 2010/0171163 A1 | 7/2010 | Kim et al. | |
| 2011/0253981 A1 | 10/2011 | Rooyackers et al. | |
| 2013/0341270 A1 | 12/2013 | Kar et al. | |
| 2014/0353593 A1 | 12/2014 | Smets | |
| 2015/0091100 A1 | 4/2015 | Xie et al. | |
| 2015/0137271 A1 | 5/2015 | Cai et al. | |
| 2016/0005850 A1 | 1/2016 | Zhao et al. | |
| 2016/0284712 A1 | 9/2016 | Liaw | |
| 2017/0229472 A1 | 8/2017 | Lu et al. | |

OTHER PUBLICATIONS

Notice of Allowance from related U.S. Appl. No. 15/097,574 dated Sep. 14, 2016.
Notice of Allowance from related U.S. Appl. No. 15/097,621 dated Sep. 19, 2016.
Notice of Allowance from related U.S. Appl. No. 15/132,383 dated Jul. 21, 2017.
Office Action from related U.S. Appl. No. 15/268,796 dated Jan. 12, 2018.

* cited by examiner

US 9,966,456 B1

METHODS OF FORMING GATE ELECTRODES ON A VERTICAL TRANSISTOR DEVICE

BACKGROUND OF THE INVENTION

1. Field of the Invention

Generally, the present disclosure relates to the manufacture of semiconductor devices, and, more specifically, to various novel methods of forming gate electrodes on a vertical transistor device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned between the source/drain regions. Upon application of an appropriate control voltage to the gate electrode, a conductive channel region forms between the drain region and the source region.

FIG. 1 is a simplistic and schematic depiction of an illustrative prior art vertical transistor device 10. In general, the vertical transistor 10 comprises a generally vertically oriented channel semiconductor structure 12A that extends upward from a front surface 12S of a semiconductor substrate 12. As indicated in the right-hand portion of FIG. 1, the semiconductor structure 12A may have a variety of different configurations when viewed from above, e.g., circular, rectangular, square, etc., and it has an outer perimeter 12P. The device 10 further comprises a channel region 13, a gate-all-around (GAA) gate structure 14 that is positioned around the perimeter 12P of the semiconductor structure 12A, a bottom source/drain (S/D) region 16, a top S/D region 18, a bottom spacer 15B, and a top spacer 15T. Also depicted is an illustrative bottom contact 20 that is conductively coupled to the bottom S/D region 16 and a top contact 22 that is conductively coupled to the top S/D region 18. In the depicted example, the gate structure 14 comprises a gate insulation layer 14A and a conductive gate electrode 14B. The materials of construction for the components of the device 10 may vary depending upon the particular application. The gate structure 14 may be manufactured using well-known gate first or replacement gate manufacturing techniques.

Device designers and manufacturers are constantly in search of device designs and methods of manufacturing that improve device performance, processing efficiencies and/or product yields. The formation of vertical transistor devices can present some special challenges. For example, the gate electrode 14B may be formed by depositing a metal layer between a plurality of closely spaced transistor devices and recessing the metal layer. It may be difficult to control the initial height of the metal layer and its post-recess height due to varying pitch between transistor devices 10 in different regions of the integrated circuit device and the effects of the pitch on the deposition and etch processes.

The present disclosure is directed to methods of simultaneously forming bottom and top spacers on a vertical transistor device that may solve or at least reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming gate electrodes on a vertical transistor device. One illustrative method disclosed herein includes, among other things, forming bottom source/drain (S/D) regions. A plurality of vertically oriented channel semiconductor structures is formed above the bottom source/drain (S/D) regions. A gate insulation layer is formed above the vertically oriented channel semiconductor structures. A conformal layer of conductive gate material is formed above the gate insulation layer. The conformal layer of conductive material is etched to define conductive gate spacers on sidewalls of the vertically oriented channel semiconductor structures. Top source/drain (S/D) regions are formed above the vertically oriented channel semiconductor structures.

Another illustrative method disclosed herein includes, among other things, forming bottom source/drain (S/D) regions. A plurality of vertically oriented channel semiconductor structures is formed above the bottom source/drain (S/D) regions. A gate insulation layer is formed above the vertically oriented channel semiconductor structures. A conformal layer of conductive gate material is formed above the gate insulation layer. The conformal layer of conductive gate material merges between at least two of the vertically oriented channel semiconductor structures. The conformal layer of conductive gate material is etched to define conductive gate spacers on sidewalls of the vertically oriented channel semiconductor structures. The conductive gate spacers are recessed. Top source/drain (S/D) regions are formed above the vertically oriented channel semiconductor structures.

BRIEF DESCRIPTION OF THE DRAWINGS

The disclosure may be understood by reference to the following description taken in conjunction with the accompanying drawings, in which like reference numerals identify like elements, and in which.

Figure 1:
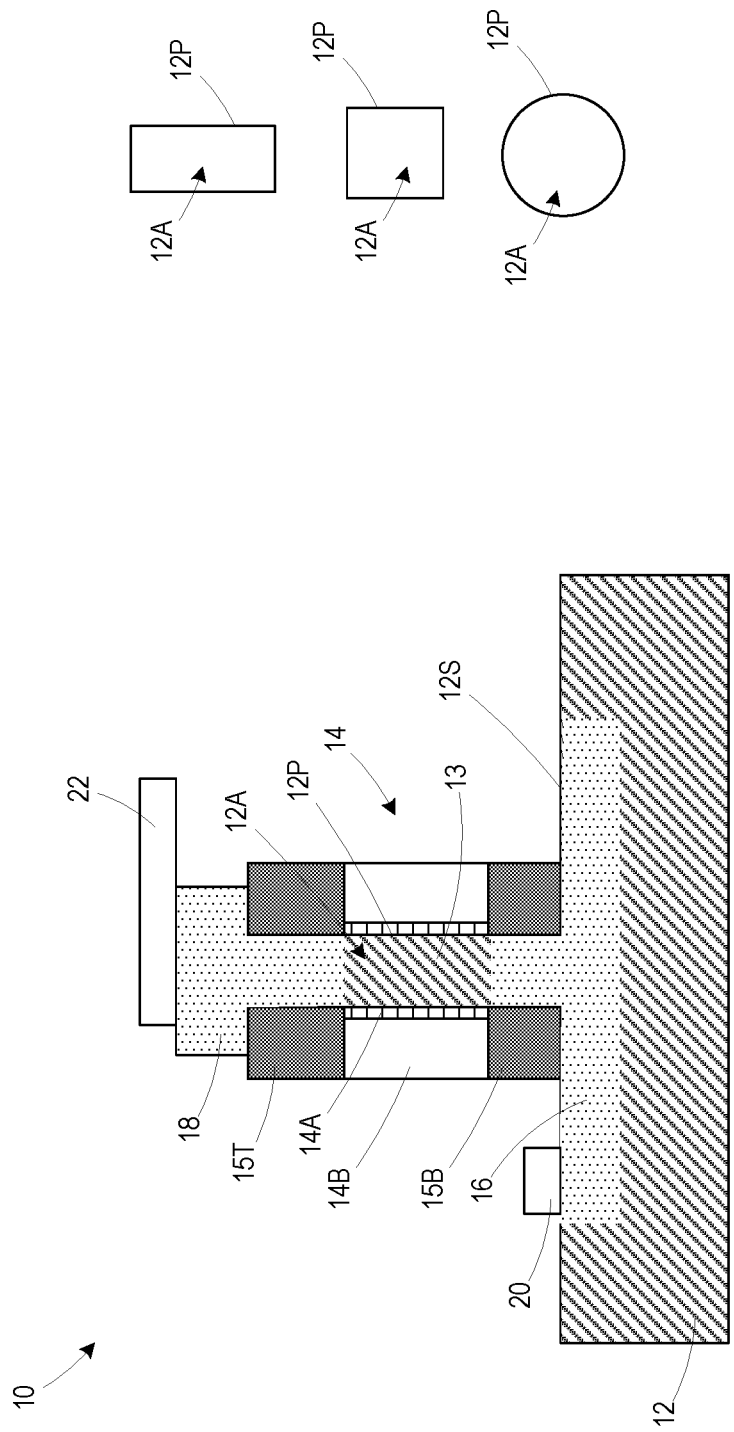
FIG. 1 simplistically depicts an illustrative prior art vertical transistor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the vertical transistor device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
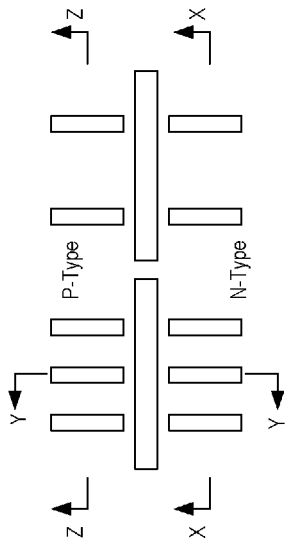
FIGS. 2A-2O depict various illustrative novel methods disclosed herein for simultaneously forming bottom and top spacers on a vertical transistor device and the resulting device.
Figure 2A:
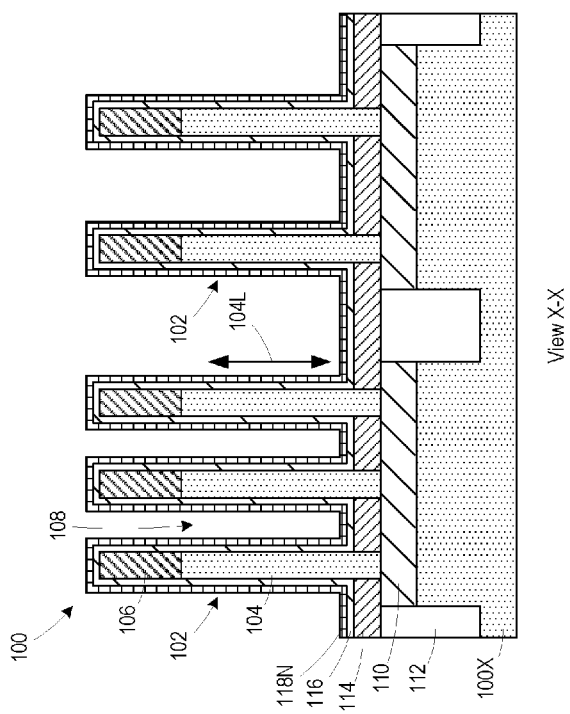
Figure 2B:
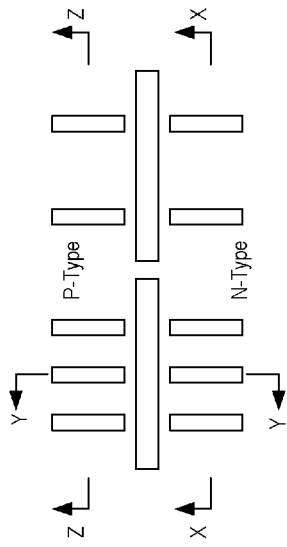
Figure 2B:
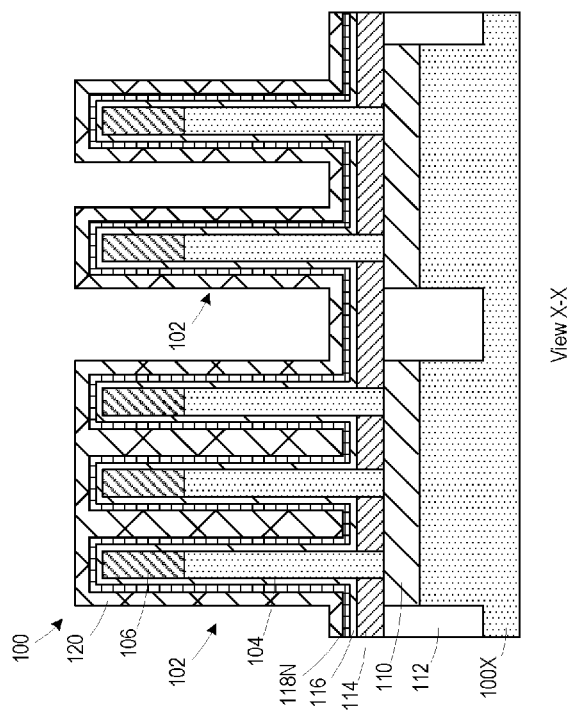
Figure 2C:
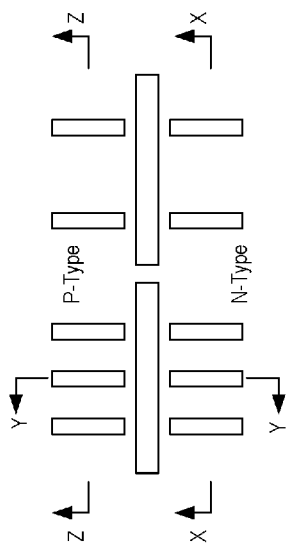
Figure 2C:
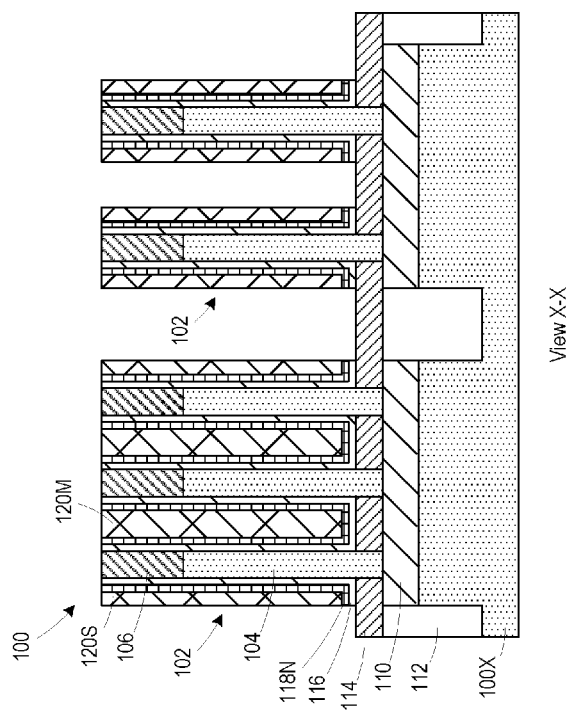
Figure 2D:
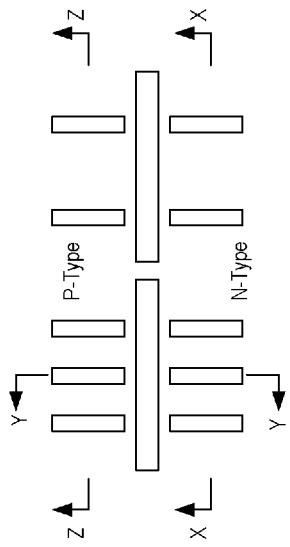
Figure 2D:
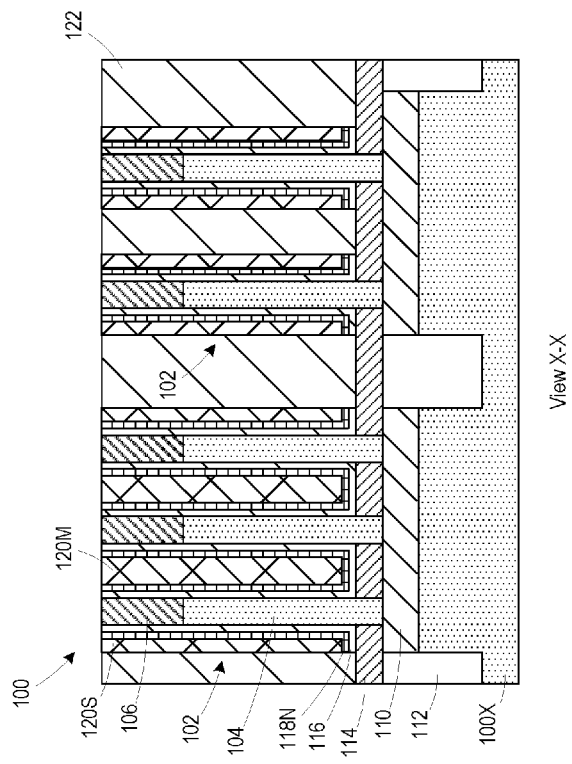
Figure 2E:
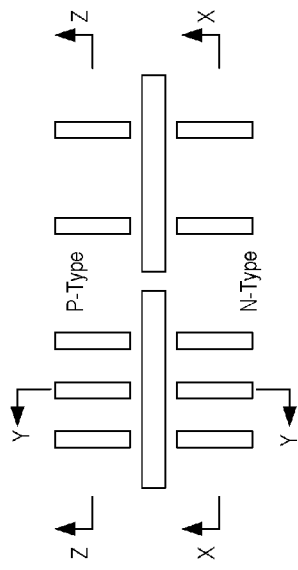
Figure 2E:
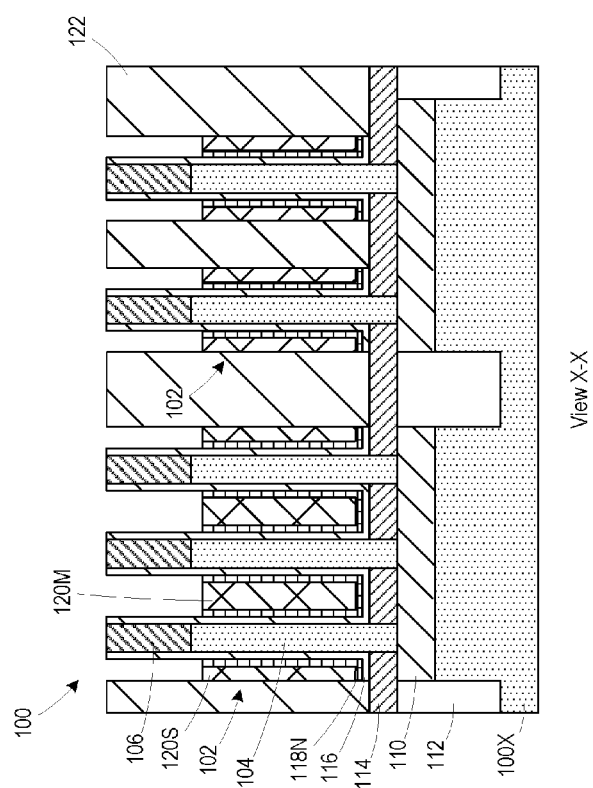
Figure 2F:
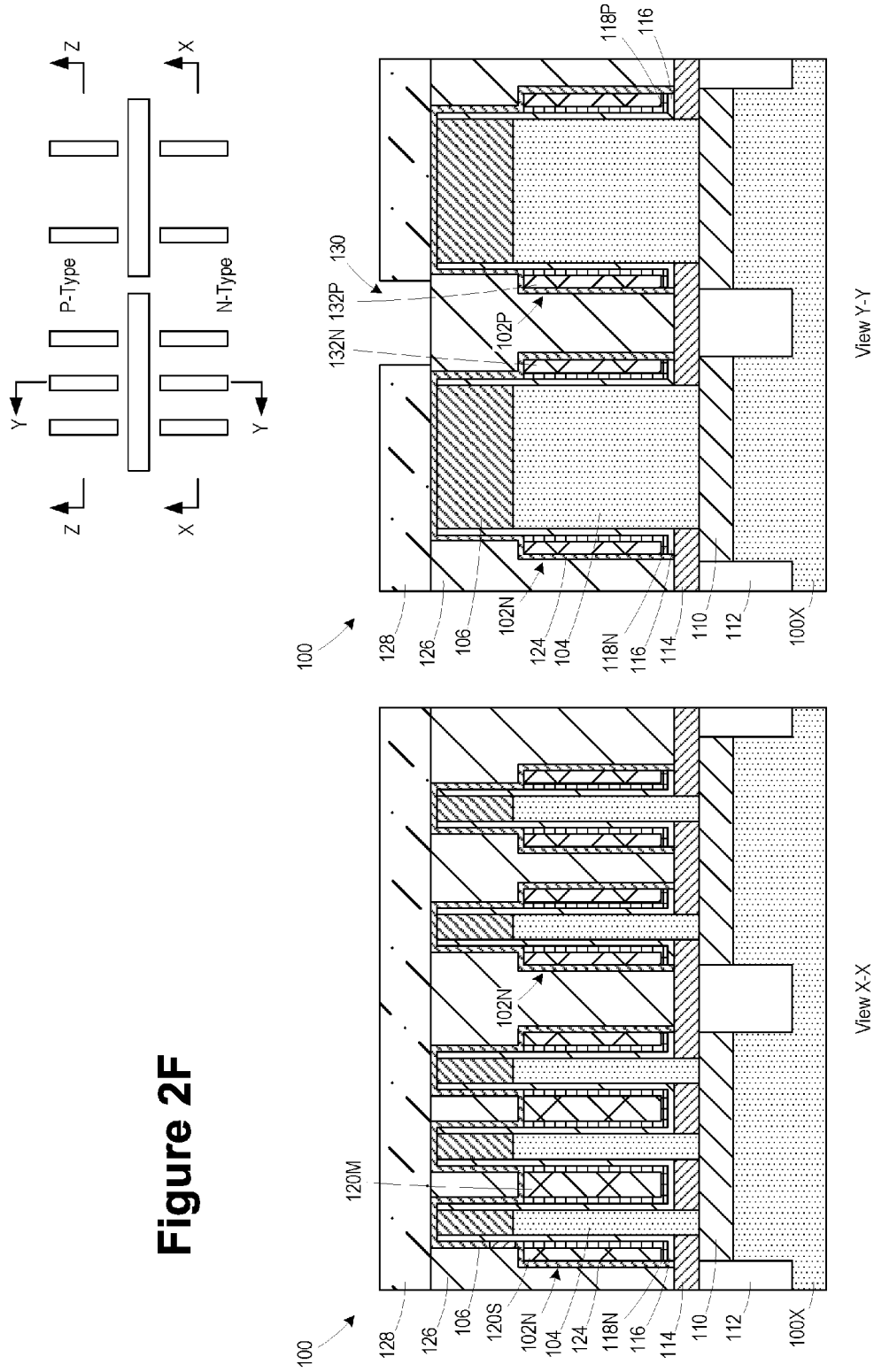
Figure 2G:
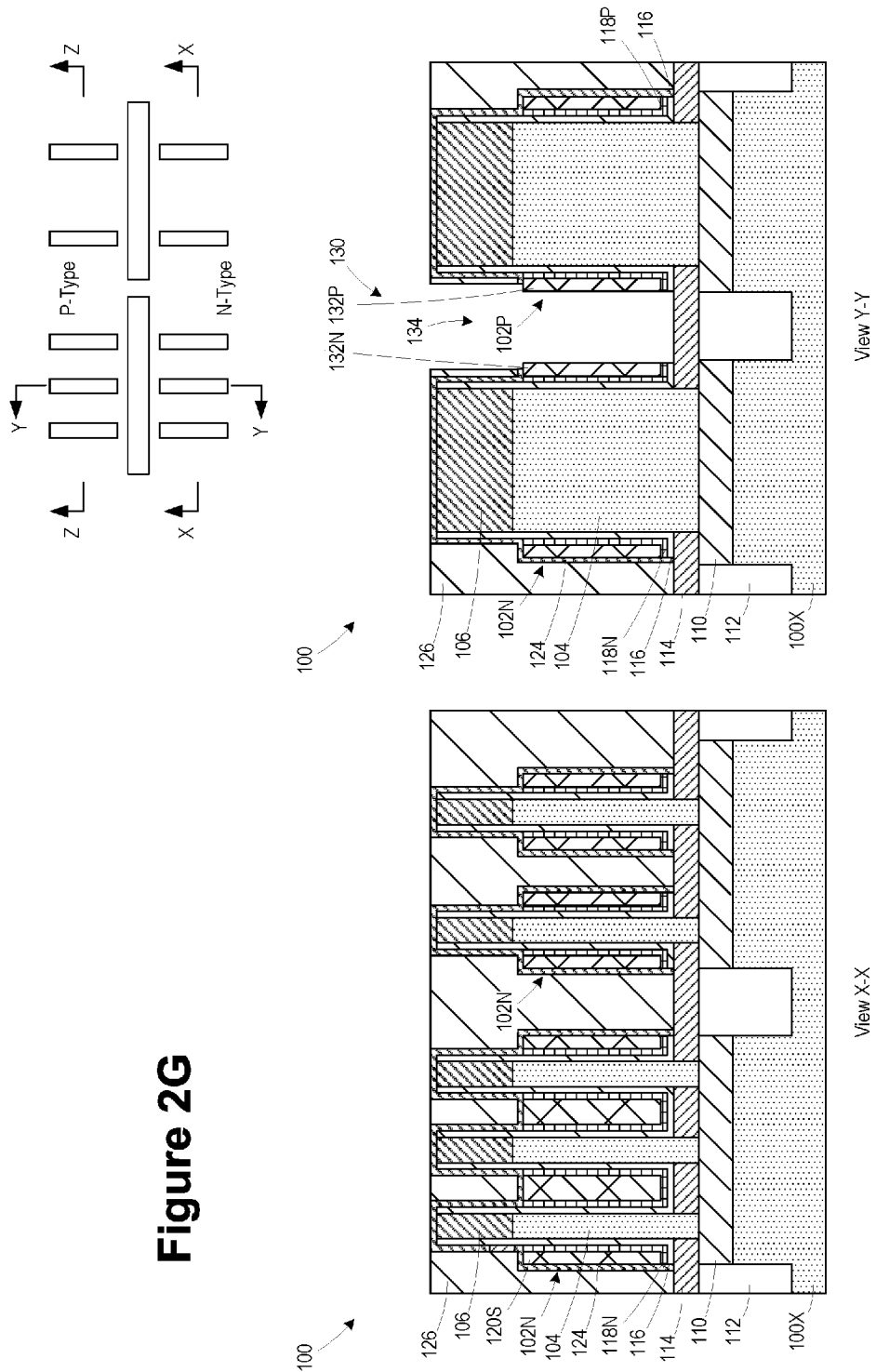
Figure 2H:
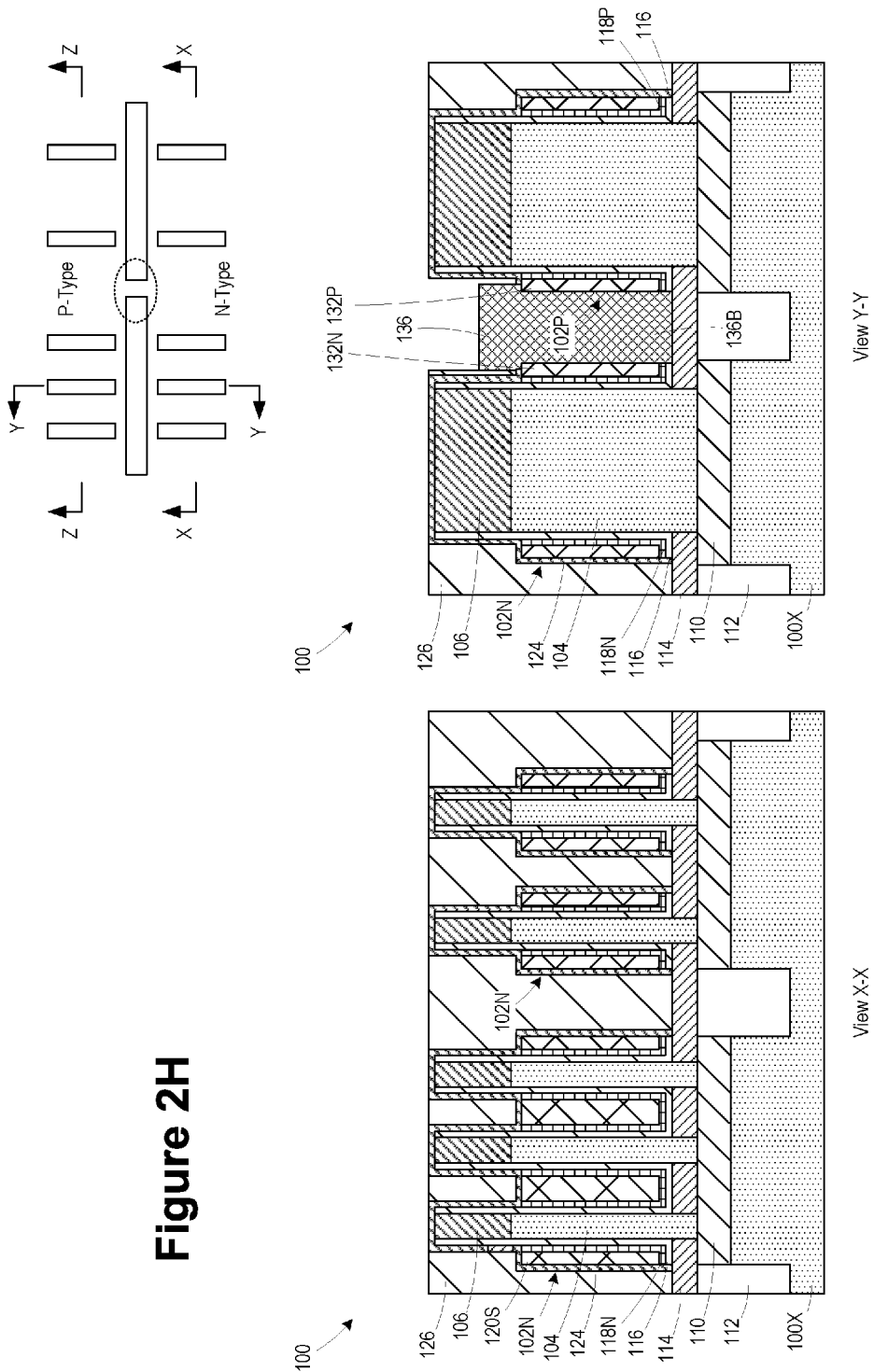
Figure 2I:
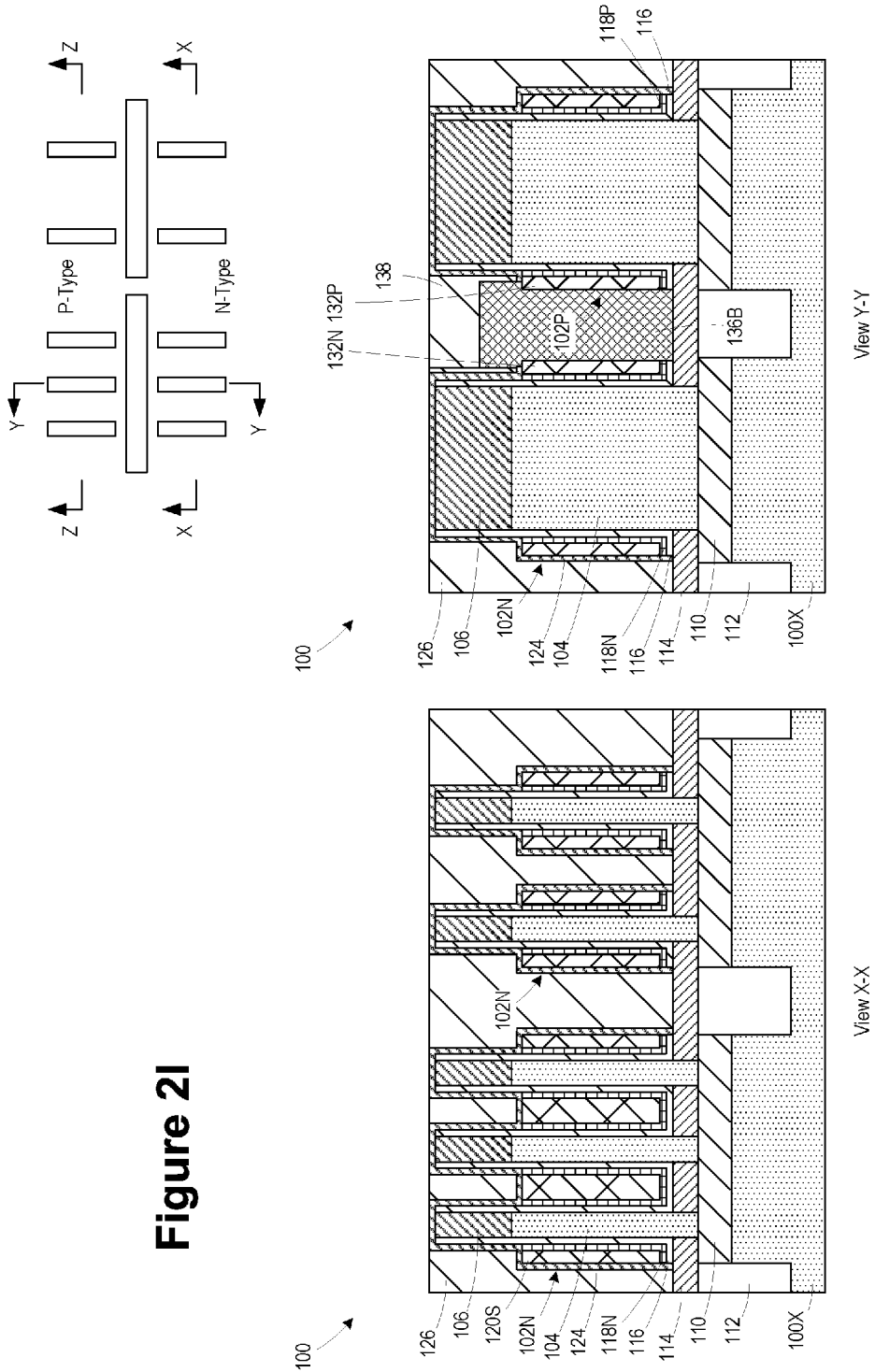
Figure 2J:
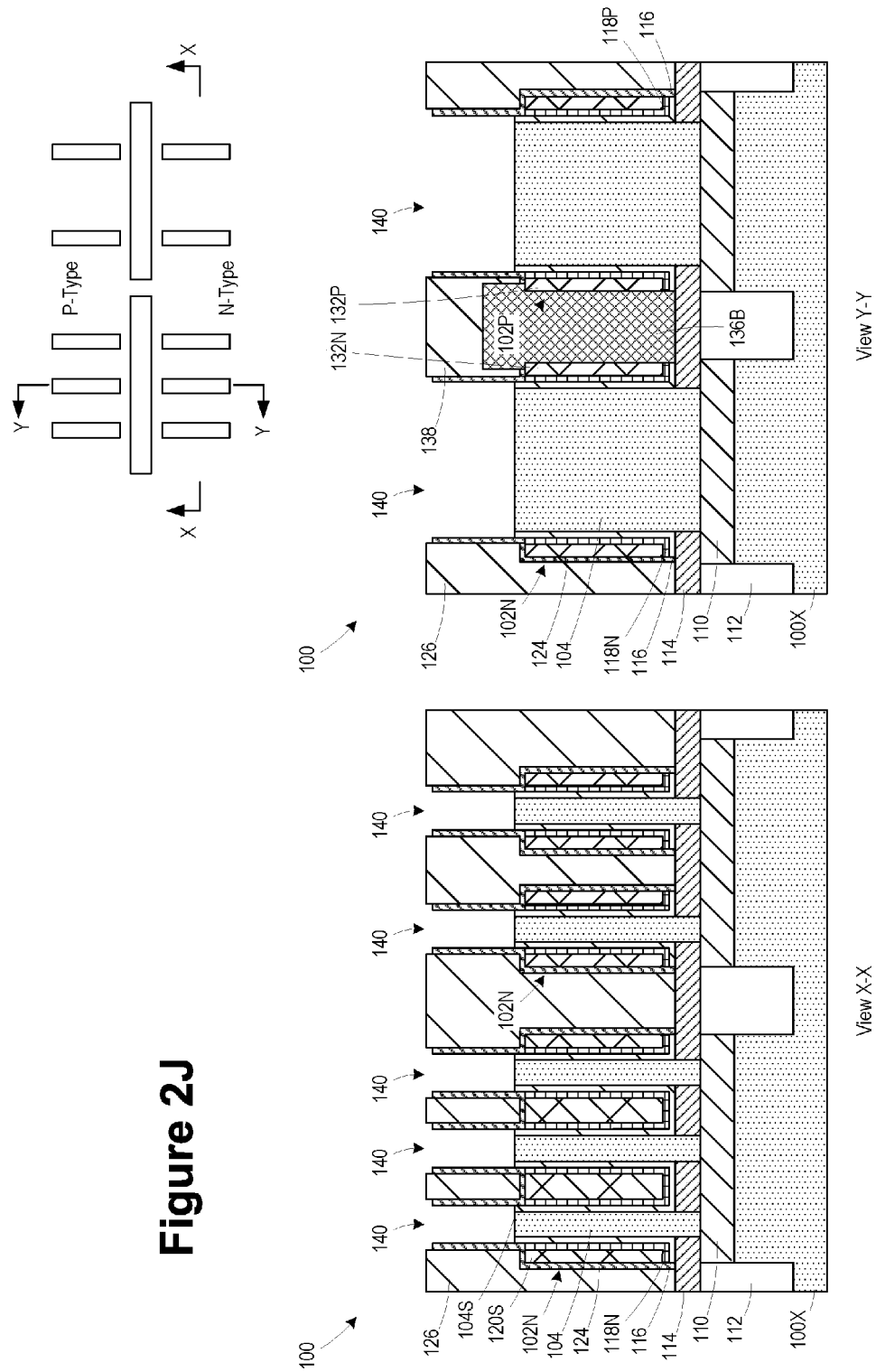
Figure 2K:
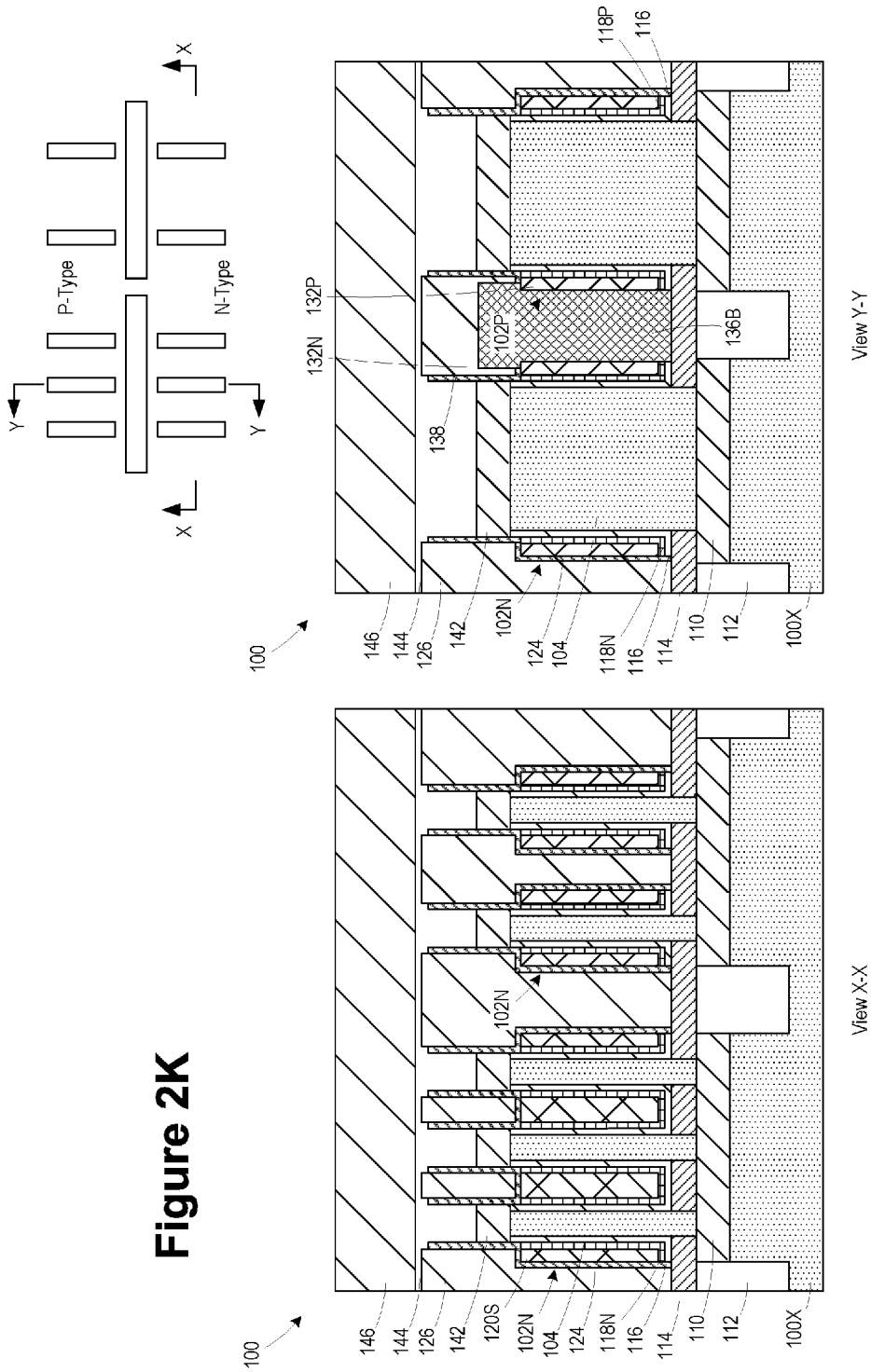
Figure 2L:
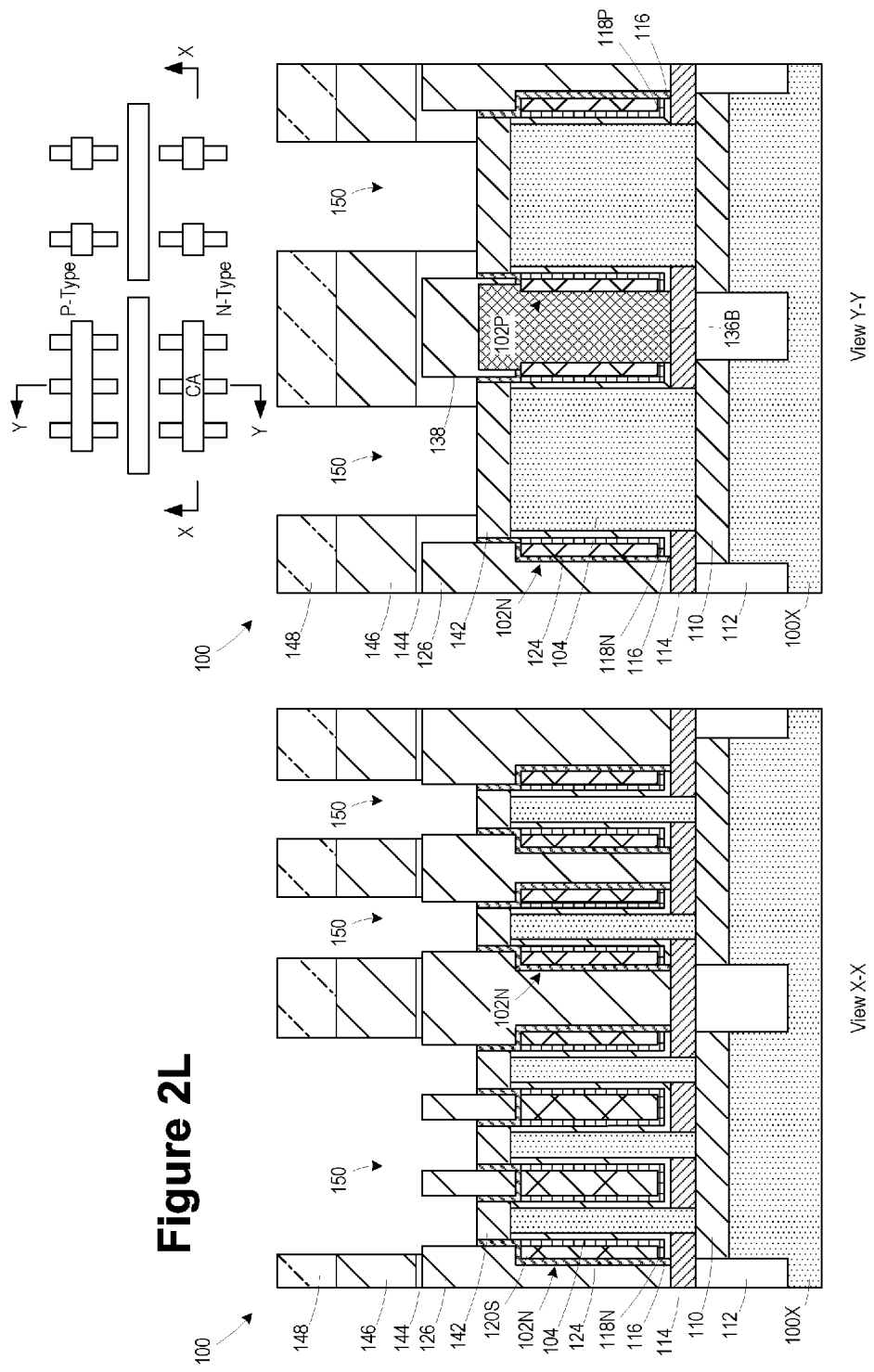
Figure 2M:
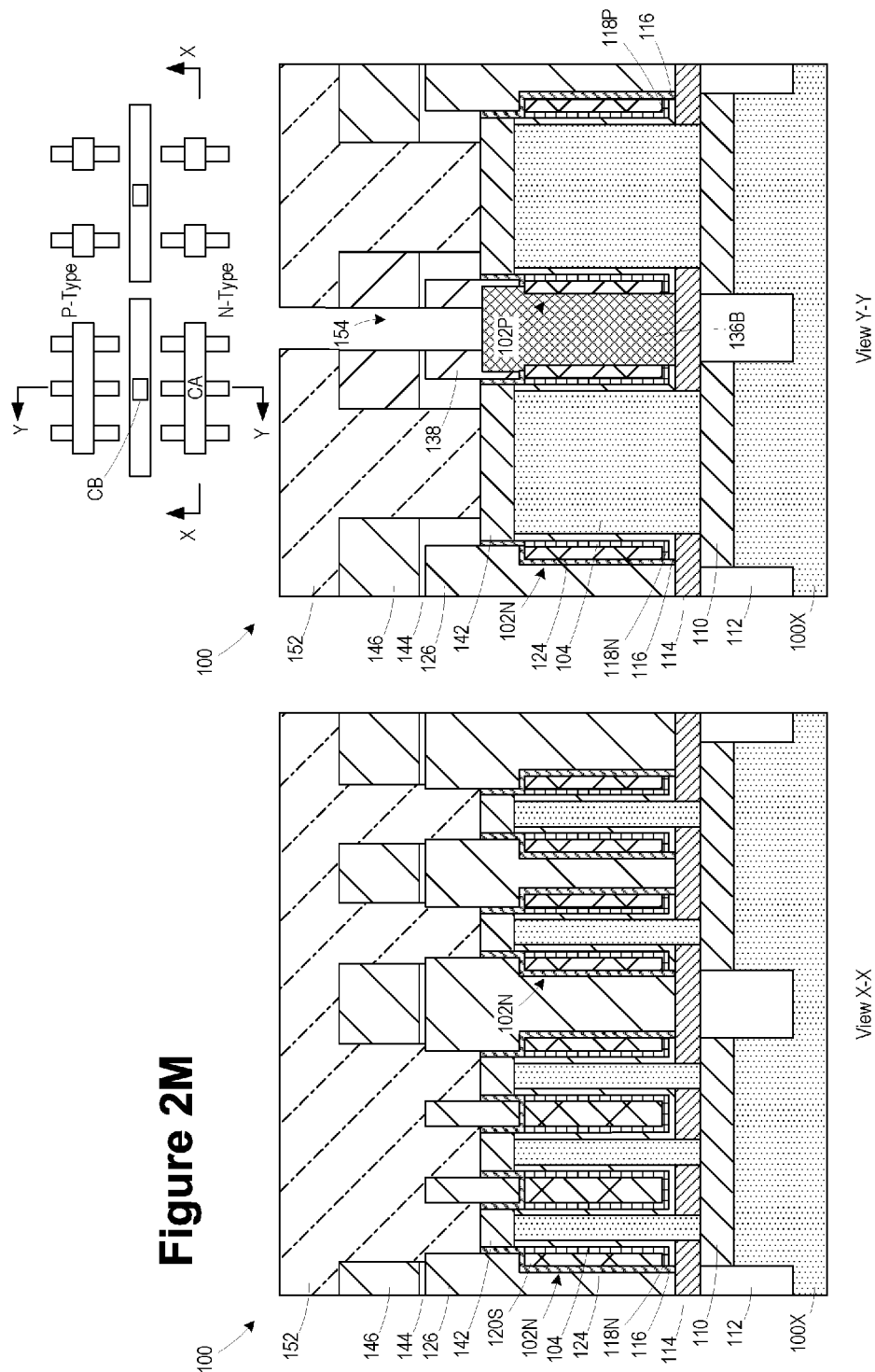
Figure 2N:
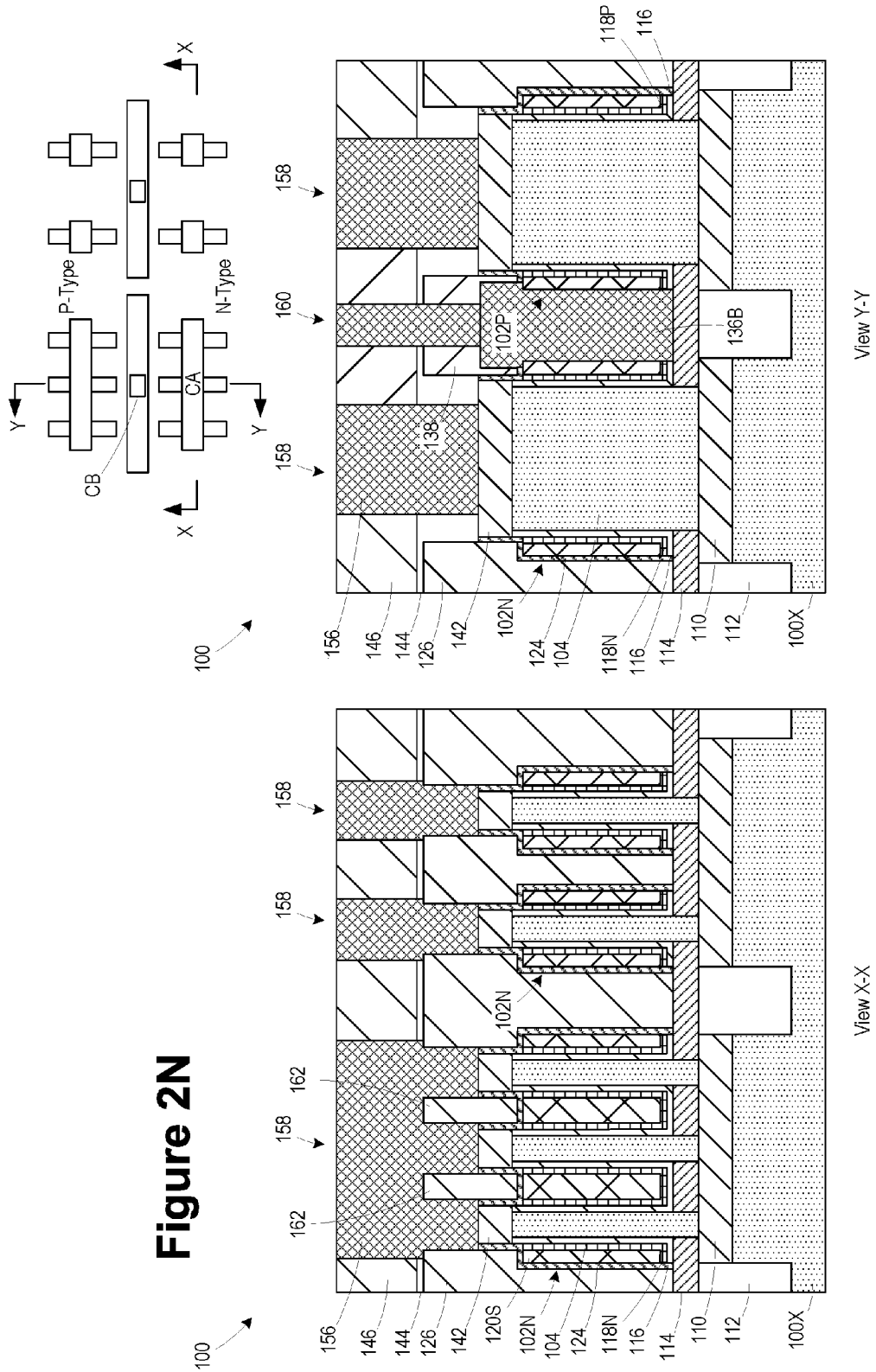
Figure 2O:
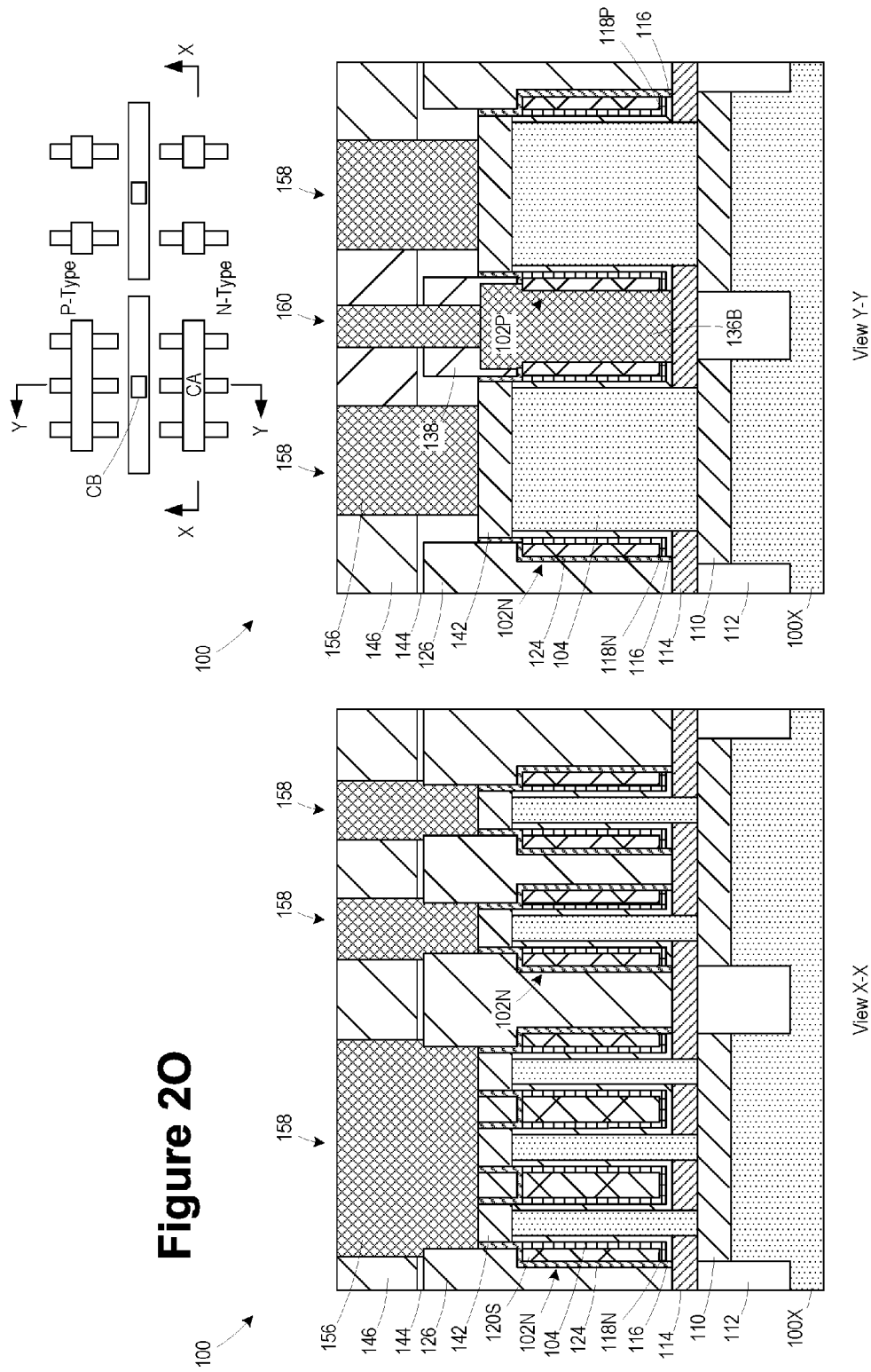

FIGS. 2A-2O depict various illustrative novel methods of forming gate electrodes on a vertical transistor device of an integrated circuit (IC) product 100 that includes a plurality of illustrative vertical transistor devices 102 each including a vertically-oriented channel semiconductor structure 104. Of course, the IC product 100 may typically include millions of such vertical transistor devices 102. In the illustrated examples, the vertical transistor devices have a rectangular cross section when viewed from above (e.g., fin-type devices). In other embodiments, the vertical transistor devices 102 may have different cross section shapes, such as circle, oval, square, etc. (as depicted in the prior art structure 10 of FIG. 1). During operation, current will flow through the vertically oriented channel semiconductor structure 104 of the vertical transistor device 102 in the direction indicated by the double arrows 104L, which is the gate length direction of the device 102. Several of the drawings also include a simplistic plan view of the IC product 100 (in the upper right corner) that depicts the location where various cross-sectional views depicted in the following drawings will be taken. More specifically, the view "X-X" is a cross-sectional view taken through a subset of the vertical transistor devices 102 that will be doped as N-type devices in a direction perpendicular to a long axis of the vertical transistor devices 102, and the view "Y-Y" is a cross-sectional view taken through one of the P-type devices, a bridge contact (not yet formed), and one of the N-type devices along the long axis. Not all aspects of the processing operations reflected in the cross-sectional views will be depicted in the plan views so as not to overly complicate the drawings.

FIG. 2A depicts one illustrative embodiment of the IC product 100 including the vertical transistor devices 102 disclosed herein at a stage of fabrication after several process operations have already been performed. In general, the IC product 100 is formed in and above a substrate 100X. The substrate 100X may have a variety of configurations, such as a bulk semiconductor (e.g., silicon) configuration. The substrate 100X may have a bulk configuration (as depicted) or a semiconductor-on-insulator (SOI) or a silicon-on-insulator configuration that includes a bulk semiconductor layer, a buried insulation layer (e.g., silicon dioxide), and an active layer (e.g., silicon), wherein semiconductor devices are formed in and above the active layer. The substrate 100X may be made of silicon or it may be made of materials other than silicon. Thus, the terms "substrate" or "semiconductor substrate" should be understood to cover all semiconducting materials and all forms of such materials.

With continuing reference to FIG. 2A, the vertically oriented channel semiconductor structures 104 have been formed for the vertical transistor devices 102. In the depicted example, the vertically oriented channel semiconductor structures 104 were formed by performing one or more etching processes through a patterned etch mask 106 (e.g., silicon nitride) so as to define a plurality of trenches 108 in the substrate 100X. In some embodiments, the patterned etch mask 106 may be comprised of one or more layers of material and it may be formed by forming one or more layers of material and thereafter patterning those materials using known photolithography and etching techniques. In one illustrative embodiment, the patterned etch mask 106 may be comprised of a layer of silicon dioxide and a layer of silicon nitride (not separately shown).

Next, in one illustrative embodiment, an ion implantation process was performed to form a bottom source/drain (S/D) region or structure 110 for the devices 102 in the substrate 100X. The bottom source/drain (S/D) region 110 may be doped with an appropriate dopant (e.g., N-type for the bottom devices in the plan view and P-type for the top devices in the plan view) depending upon the type of device 102 under construction. In some applications, and other process flows, the bottom source/drain (S/D) region 110 may be made of the same semiconductor material as that of the substrate 100X, or it may be made of a semiconductor material that is different than that of the substrate 100X. Then, isolation trenches 112 that extend into the substrate 100X were defined by performing an etching process through a patterned etch mask (not shown), e.g., a patterned layer of photoresist material. The patterned etch mask was then removed. Although the bottom S/D region 110 is shown as a continuous structure for a subset of the vertically oriented channel semiconductor structures 104, in some embodiments, separate bottom S/D regions 110 may be provided.

Next, a deposition process was performed to form a bottom spacer 114 (e.g., silicon nitride) above the bottom S/D region 110. Another deposition process was performed to form a gate insulation layer 116 above the bottom spacer 114 and the vertically oriented channel semiconductor structures 104. In the illustrated embodiment, the gate insulation layer 116 is comprised of a high-k (k greater than 10) insulation material (where k is the relative dielectric constant), such as hafnium oxide. Yet another deposition process was performed to form a work function material layer 118N above the gate insulation layer 116. The work function material layer 118N is tailored for an N-type device. One or more barrier layers (not shown) may be formed between the gate insulation layer 116 and the work function material layer 118N. In some embodiments, the work function material layer 118N may comprise TiAl, Al doped TiN, etc. The work function material layer 118N may include a stack of layers including, for example, TiN/TiAl, TiN/AlN, or TiN/TiAlN, etc. (the individual layers are not separately depicted in the drawings), formed using a sequence of conformal deposition processes.

FIG. 2B illustrates the IC product 100 after a conformal deposition process was performed to form a conductive layer 120 (e.g., tungsten formed using an atomic layer deposition (ALD) process) above the work function material layer 118N. In some embodiments, the ALD process may include a reducing agent of $H_2$, atomic hydrogen, $B_2$, $H_6$, etc. A temperature range of about 100-500° C. (e.g., 400° C.) and a pressure range of about 0.1-700 Torr (e.g., 10-20 Torr) may be employed. In the cavities between the densely-spaced vertically oriented channel semiconductor structures 104 (on the left), the conductive layer pinches off to completely fill the cavities, while the cavities between the less densely-spaced vertically oriented channel semiconductor structures 104 (on the right) are not filled. The use of a conformal deposition process provides a consistent layer thickness for the conductive layer 120 across the regions of varying density.

FIG. 2C depicts the IC product 100 after one or more etch processes (e.g., anisotropic) were performed to define conductive gate spacers 120S from the conductive layer 120 and to remove exposed portions of the gate insulation layer 116 and the work function material layer 118N. The conductive gate spacers 120S formed between the dense structures 104 are essentially merged gate spacers 120M.

FIG. 2D illustrates the IC product 100 after a deposition process was performed to form a dielectric layer 122 (e.g., silicon dioxide) above the structures 104 and a planarization process was performed to remove an upper portion of the dielectric layer 122 to expose the conductive gate spacers 120S, 120M. In some embodiments, a liner layer (e.g., silicon nitride—not shown) may be formed prior to forming the dielectric layer 122.

FIG. 2E illustrates the IC product 100 after an etch process was performed to recess the conductive gate spacers 120S, 120M and remove exposed portions of the work function material layer 118N. In some embodiments, the conductive gate spacers 120S, 120M may be recessed by an etch environment including $SF_6$ or $NF_3$ with additive gasses such as AR or He with no bias power, a source power of about 300-2000 W, and a pressure of about 1-50 mT. The work function material layer 118N may be removed by an etch environment using $Cl_2/BCl_3$ with additive gasses such as AR or He with no bias power, a source power of about 300-2000 W, and a pressure of about 1-50 mT. The conductive gate spacers 120S, 120M define gate electrodes for the transistor devices 102.

FIG. 2F illustrates the IC product 100 after several process operations were performed. FIG. 2F includes view "Y-Y" showing the N-type transistor device 102N and the P-type transistor device 102P. First, an etch process was performed to remove remaining portions of the dielectric layer 122. Second, a relatively thin liner layer 124 was formed above the IC product 100 by performing a conformal deposition process, e.g., ALD, CVD. In one illustrative embodiment, the liner layer 124 may be comprised of a material such as silicon nitride, silicon oxynitride, etc. The thickness of the liner layer 124 may vary depending upon the particular application, e.g., 2-3 nm. Then, a dielectric layer 126, e.g., silicon dioxide, was blanket-deposited across the IC product 100 and above the liner layer 124. Thereafter, a planarization process, such as a CMP (Chemical Mechanical Planarization) process was performed on the layer of insulating material 126 that stops on the upper surface of the liner layer 124. Subsequently, a patterned mask layer 128 was formed above the dielectric layer 126. The patterned mask layer 128 includes an opening 130 disposed between the N-type transistor device 102N and the P-type transistor device 102P above a gate electrode 132N of the N-type transistor device 102N and a gate electrode 132P of the P-type transistor device 102. The gate electrodes 132N, 132P were defined by the conductive gate spacers 120M, 120S as previously described, as illustrated in view "Y-Y". Also, note that the work function material layer 118N for the N-type transistor device 102N may be different than the work function material layer 118P for the P-type transistor device 102P. For example, the work function material layer 118P may include TiN.

FIG. 2G depicts the IC product 100 after a plurality of processes was performed. One or more etch processes were performed on the dielectric layer 126 through the opening 130 in the patterned mask layer 128 so as to remove exposed portions of the dielectric layer 126 and exposed portions of the liner layer 124. A subsequent etch process was performed to remove the patterned mask layer 128. These process operations result in the formation of a cavity 134 in the dielectric layer 126 exposing the gate electrodes 134N, 134P.

FIG. 2H illustrates the IC product 100 after several process operations were performed. First, a deposition process was performed to fill the cavity 134 with a conductive material 136. The conductive material 136 may include multiple layers (not separately shown), such as a barrier layer (e.g., TiN, and a conductive fill material, e.g., tungsten). Next, a planarization process was performed to remove portions of the conductive material 136 extending beyond the opening and a recess etch process was performed to recess a top surface of the conductive material 136 to define a bridge contact 136B connecting the gate electrodes 134N, 134P. In some embodiments, an additional patterned etch process (not shown) may be performed to segment the conductive material 136 (e.g., in the circled region shown in the plan view.

FIG. 2I illustrates the IC product 100 after several processes were performed. A deposition process was performed to form a dielectric layer 138, e.g., silicon dioxide. Thereafter, a planarization process, such as a CMP (Chemical Mechanical Planarization) process was performed on the dielectric layer 138 that stops on the upper surface of the liner layer 124.

FIG. 2J illustrates the IC product 100 after a plurality of processes was performed. A first etch process was performed to remove the exposed surfaces of the liner layer 124 and the patterned etch mask 106 selectively relative to the surrounding materials and structures, thereby defining a cavity 140 and exposing an upper surface 104S of the vertically oriented channel semiconductor structures 104. A second etch process was performed to remove the exposed portions of the gate insulation layer 116.

FIG. 2K depicts the IC product 100 after several process operations were performed. First, an epitaxial growth process was performed to form a top source/drain (S/D) region or structure 142 in the cavity 140 and on the upper surface 104S of the vertically oriented channel semiconductor structures 104. The top source/drain (S/D) region 142 may be comprised of different materials depending upon the type of device under construction, e.g., SiGe for a P-type device, SiC for an N-type device. The top source/drain (S/D) region 142 may be in situ doped with an appropriate dopant (N-type or P-type depending upon the type of device under construction) during the formation of the top source/drain (S/D) region 142. Next, a deposition process was performed to form a sacrificial layer 144 (e.g., silicon nitride) in the cavities 140. The sacrificial layer 144 may overfill the cavities 140, as illustrated FIG. 2K. In some embodiments, an optional planarization process may be performed to remove the over fill portions of the sacrificial layer 144 (not shown). Then a deposition process was performed to form a dielectric layer 146 (e.g., silicon dioxide) above the sacrificial layer 144.

FIG. 2L depicts the IC product 100 after several process operations were performed. First, a mask layer 148, e.g., a patterned layer of photoresist, was formed so as to cover the dielectric layer 146. Then, a first etch process was performed to etch the dielectric layer 146, with an etch stop provided by the sacrificial layer 144. Then, an etch process was performed to selectively remove the exposed portions of the sacrificial layer 144, terminating on the top S/D/regions 142 and defining cavities 150 (e.g., CA cavities).

FIG. 2M depicts the IC product 100 after several process operations were performed. First, an ashing process was performed to remove the mask layer 148. Then, a mask layer 152, e.g., a patterned layer of photoresist, was formed so as to cover the dielectric layer 146 and fill the cavities 150. Then, a plurality of etch processes were performed to etch through the portions of the dielectric layer 146, the sacrificial layer 144, and the dielectric layer 138 exposed by the mask layer 152 to define a cavity 154 (e.g., a CB cavity) exposing the conductive material 136B, with an etch stop provided by the sacrificial layer 144. Then, an etch process was performed to selectively remove the exposed portions of the sacrificial layer 144, terminating on the top S/D/regions 142 and defining cavities 150 (e.g., CA cavities).

FIG. 2N depicts the IC product 100 after several process operations were performed. First, an ashing process was performed to remove the mask layer 152. Then, one or more deposition processes were performed to fill the cavities 150, 154 with a conductive material 156. The conductive material 156 may include multiple layers (not separately shown), such as a barrier layer (e.g., TiN and a conductive fill material (e.g., tungsten). Next, a planarization process was performed to remove portions of the conductive material 156 extending beyond the opening to define source/drain contacts 158, and a gate contact 160. At this point in the process flow, traditional metallization layers (not shown) may be formed above the IC product 100 so as to establish electrical connections to the contacts 158, 160.

FIG. 2O depicts the IC product 100 in an alternative process flow. As shown in FIG. 2N, pillars 162 in the dielectric layer 126 are present between the densely spaced transistor devices 102. In the alternative process flow, the pillars 162 may be reduced and substantially removed during the etch processes and cleaning processes (not separately described). For example, the pillars 162 may be reduced during the etch processes described in reference to FIG. 2L and essentially removed during a preclean process performed prior to forming the conductive material 156. FIG. 2O illustrates the IC product 100 with the pillars 162 removed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a vertical transistor device, the method comprising:
   forming bottom source/drain (S/D) regions;
   forming a plurality of vertically oriented channel semiconductor structures above said bottom source/drain (S/D) regions;
   forming a gate insulation layer above said vertically oriented channel semiconductor structures;
   forming a conformal layer of conductive gate material above said gate insulation layer;
   etching said conformal layer of conductive gate material to define conductive gate spacers on sidewalls of said vertically oriented channel semiconductor structures; and
   forming top source/drain (S/D) regions above said vertically oriented channel semiconductor structures.

2. The method of claim 1, further comprising recessing said conductive gate spacers.

3. The method of claim 2, wherein said conductive gate spacers between a first pair of said vertically oriented channel semiconductor structures merge to define a merged conductive gate spacer, and the method further comprises recessing said conductive gate spacers and said merged conductive gate spacer.

4. The method of claim 1, wherein a mask layer is formed on upper surfaces of said vertically oriented channel semiconductor structures, and the method further comprises:
   forming a dielectric layer above said vertically oriented channel semiconductor structures and said mask layer;
   planarizing said dielectric layer to expose said mask layer;
   removing said mask layer to define a plurality of cavities exposing said upper surfaces of said vertically oriented channel semiconductor structures; and
   forming said top S/D regions on said upper surfaces of said vertically oriented channel semiconductor structures to at least partially fill said cavities.

5. The method of claim 1, wherein a mask layer is formed on upper surfaces of said vertically oriented channel semiconductor structures, and the method further comprises:
   forming a liner layer above said vertically oriented channel semiconductor structures and said mask layer;
   forming a dielectric layer above said liner layer;
   planarizing said dielectric layer to expose portions of said liner layer;
   removing said exposed portions of said liner layer and said mask layer to define a plurality of cavities exposing said upper surfaces of said vertically oriented channel semiconductor structures; and
   forming said top S/D regions on said upper surfaces of said vertically oriented channel semiconductor structures to at least partially fill said cavities.

6. The method of claim 1, further comprising:
   forming a first dielectric layer above said vertically oriented channel semiconductor structures;
   forming a cavity in said first dielectric layer exposing a first conductive gate spacer associated with a first one of said vertically oriented channel semiconductor structures and a second conductive gate spacer associated with a second one of said vertically oriented channel semiconductor structures; and
   forming a bridge contact in said cavity coupling said first and second conductive gate spacers.

7. The method of claim 6, wherein forming said bridge contact comprises:
   filling said cavity with a first conductive material;
   recessing said first conductive material; and
   forming a second dielectric layer above said recessed first conductive material.

8. The method of claim 7, further comprising:
   forming a third dielectric layer above said first and second dielectric layers;
   forming first openings in said first and third dielectric layers exposing said top S/D regions;
   forming a second opening in said second and third dielectric layers exposing said bridge contact;
   forming source/drain (S/D) contacts in said first openings; and
   forming a gate contact in said second opening.

9. The method of claim 8, wherein forming said S/D contacts and said gate contact further comprises concurrently forming a second conductive material in said first openings and said second opening.

10. The method of claim 1, wherein said conformal layer of conductive gate material comprises tungsten.

11. The method of claim 1, wherein forming said conformal layer of conductive gate material comprises performing an atomic layer deposition process.

12. A method of forming a vertical transistor device, the method comprising:
   forming bottom source/drain (S/D) regions;
   forming a plurality of vertically oriented channel semiconductor structures above said bottom source/drain (S/D) regions;
   forming a gate insulation layer above said vertically oriented channel semiconductor structures;
   forming a conformal layer of conductive gate material above said gate insulation layer, wherein said conformal layer of conductive gate material merges between at least two of said vertically oriented channel semiconductor structures;
   etching said conformal layer of conductive gate material to define conductive gate spacers on sidewalls of said vertically oriented channel semiconductor structures;
   recessing said conductive gate spacers; and
   forming top source/drain (S/D) regions above said vertically oriented channel semiconductor structures.

13. The method of claim 12, wherein a mask layer is formed on upper surfaces of said vertically oriented channel semiconductor structures, and the method further comprises:
   forming a dielectric layer above said vertically oriented channel semiconductor structures and said mask layer;
   planarizing said dielectric layer to expose said mask layer;
   removing said mask layer to define a plurality of cavities exposing said upper surfaces of said vertically oriented channel semiconductor structures; and
   forming said top S/D regions on said upper surfaces of said vertically oriented channel semiconductor structures to at least partially fill said cavities.

14. The method of claim 12, wherein a mask layer is formed on upper surfaces of said vertically oriented channel semiconductor structures, and the method further comprises:
   forming a liner layer above said vertically oriented channel semiconductor structures and said mask layer;
   forming a dielectric layer above said liner layer;
   planarizing said dielectric layer to expose portions of said liner layer;
   removing said exposed portions of said liner layer and said mask layer to define a plurality of cavities exposing said upper surfaces of said vertically oriented channel semiconductor structures; and
   forming said top S/D regions on said upper surfaces of said vertically oriented channel semiconductor structures to at least partially fill said cavities.

15. The method of claim 12, further comprising:
   forming a first dielectric layer above said vertically oriented channel semiconductor structures;
   forming a cavity in said first dielectric layer exposing a first conductive gate spacer associated with a first one of said vertically oriented channel semiconductor structures and a second conductive gate spacer associated with a second one of said vertically oriented channel semiconductor structures; and
   forming a bridge contact in said cavity coupling said first and second conductive gate spacers.

16. The method of claim 15, wherein forming said bridge contact comprises:
   filling said cavity with a first conductive material;
   recessing said first conductive material; and forming a second dielectric layer above said recessed first conductive material.

17. The method of claim 16, further comprising:

forming a third dielectric layer above said first and second dielectric layers;

forming first openings in said first and third dielectric layers exposing said top S/D regions;

forming a second opening in said second and third dielectric layers exposing said bridge contact; and forming source/drain (S/D) contacts in said first openings; and forming a gate contact in said second opening.

18. The method of claim 17, wherein forming said S/D contacts and said gate contact further comprises concurrently forming a second conductive material in said first openings and said second opening.

19. The method of claim 12, wherein said conformal layer of conductive gate material comprises tungsten.

20. The method of claim 12, wherein forming said conformal layer of conductive gate material comprises performing an atomic layer deposition process.

\* \* \* \* \*